United States Patent
Katz (10) Patent No.: US 7,693,216 B1
(45) Date of Patent: Apr. 6, 2010

(54) MODULATING TRANSMISSION TIMING FOR DATA COMMUNICATIONS

(75) Inventor: Daniel A. Katz, 87 Tzahal st., Kiryat Ono (IL) 55451

(73) Assignee: Daniel A. Katz, Kiryat-Ono (IL)

( * ) Notice: Subject to any disclaimer, the term of this patent is extended or adjusted under 35 U.S.C. 154(b) by 0 days.

(21) Appl. No.: 12/391,285

(22) Filed: Feb. 24, 2009

(51) Int. Cl.
*H03K 7/04* (2006.01)

(52) U.S. Cl. ...................................... 375/239
(58) Field of Classification Search ............. 375/239, 375/238
See application file for complete search history.

(56) References Cited

U.S. PATENT DOCUMENTS

| | | | |
|---|---|---|---|
| 4,584,720 A | 4/1986 | Garrett | |
| 2005/0031021 A1* | 2/2005 | Baker et al. | 375/142 |
| 2008/0112512 A1* | 5/2008 | Ekbal et al. | 375/340 |
| 2009/0117928 A1* | 5/2009 | Ladd et al. | 455/502 |

* cited by examiner

*Primary Examiner*—Kevin Y Kim (57) ABSTRACT

A modulation method, applicable for augmentation of present art modulated signals. The method, for communicating data from a transmitter to a receiver, is based on periodical burst transmissions, set at a nominal timing, of signals which are either pure carriers or already modulated by data (e.g. ASK, FSK, PSK). Knowing the transmission timing and assessing the propagation delay, the receiver can estimate the nominal reception timing of these periodical transmissions. Modifying the nominal timing of a transmission, by a specific time period, is used to communicate a symbol between the transmitter and the receiver, according to a predefined encoding table which associates between a symbol and a unique time period. According to one embodiment of the invention, the transmitter is a distress radio beacon, configured to report its position upon activation, in periodical data burst transmissions, to ground stations through satellites. The present method is used to augment this report, complying with the present beacon specifications, yet providing a finer resolution of the reported coordinates. According to one embodiment, the position resolution is improved approximately from 125 to 8 meters.

18 Claims, 7 Drawing Sheets

Transmitter Block Diagram

Figure 1 – Transmission Timing Modulation

1a. Nominal Transmission Timing

1b. Encoding Table

| symbol | unique time period |
|--------|--------------------|
| 000    | -1                 |
| 001    | -2                 |
| 010    | -3                 |
| 011    | -4                 |
| 100    | +1                 |
| 101    | +2                 |
| 110    | +3                 |
| 111    | +4                 |

1c. Symbols Encoded in Transmission Timing

Figure 2 – Transmission and Receiving Timing

2a. Nominal Transmission Timing

2b. Nominal Receiving Timing

2c. Modulated Transmission Timing

2d. Modulated Receiving Timing

Figure 3 – Transmission Timing Relative Modulation

3a. Nominal Transmission Timing

3b. Encoding Table

| symbol | unique time period |
|--------|--------------------|
| 000    | -1                 |
| 001    | -2                 |
| 010    | -3                 |
| 011    | -4                 |
| 100    | +1                 |
| 101    | +2                 |
| 110    | +3                 |
| 111    | +4                 |

3c. Symbols Relatively Encoded in Transmission Timing

Figure 4 – Transmission Timing Randomization (permutation)

4a. Nominal Transmission Timing

4b. Encoding Table

| symbol | unique time period | key -1 second unique time period | key -2 second unique time period |
|---|---|---|---|
| 000 | -1 | +4 | -3 |
| 001 | -2 | -1 | +2 |
| 010 | -3 | -2 | -4 |
| 011 | -4 | -4 | +4 |
| 100 | +1 | +2 | -1 |
| 101 | +2 | -3 | +1 |
| 110 | +3 | +1 | -2 |
| 111 | +4 | +3 | +3 |

4c. Symbols Randomly Encoded in Transmission Timing

Figure 5 – Transmission Timing Randomization (XOR)

5a. Nominal Transmission Timing

5b. Encoding Table

| symbol | unique time period [sec] | binary representation of unique time period | representation of modified time period | modified time period [sec] |
|---|---|---|---|---|
| 000 | -2.45 | 00000000 | 00110101 | -1.42 |
| 001 | -1.75 | 00100100 | 00010001 | -2.12 |
| 010 | -1.05 | 01001000 | 01111101 | -0.02 |
| 011 | -0.35 | 01101100 | 01011001 | -0.72 |
| 100 | 0.35 | 10010000 | 10100101 | 0.76 |
| 101 | 1.05 | 10110100 | 10000001 | 0.06 |
| 110 | 1.75 | 11011000 | 11101101 | 2.16 |
| 111 | 2.45 | 11111100 | 11001001 | 1.46 |

XOR 00110101

5c. Symbols Randomly Encoded in Transmission Timing

Figure 6 – Transmitter Block Diagram

Figure 7 – Receiver Block Diagram

MODULATING TRANSMISSION TIMING FOR DATA COMMUNICATIONS

BACKGROUND OF THE INVENTION

The present invention relates to the art of digital communications, particularly modulation and encoding methods, specifically in which the information to be transmitted is conveyed by means of the relative position of pulses in a series of transmitted pulses or the time or spacing between pulses.

Communication, as well known, is the process of conveying information (also referred to as "data" hereinafter), from a sender, or more technically speaking a transmitter, to a receiver, via a medium. Such a medium can be a twisted pair of copper wires, a laser beam or an RF carrier, to name a few. Information can be encoded in various ways, such as an analog voltage representing human sound amplitude and frequency and pitch, or a series of digital pulses representing the geographical coordinates of a specific location, and so on. Typically, information is communicated by modulating a carrier wave, e.g. changing its amplitude or frequency or phase, in a way that uniquely encodes the transmitted information.

It is to be noted that the term "modulation" is usually related in the art to the process of varying a periodic waveform, usually a carrier wave (e.g. RF); "encoding" is usually related to transforming information from one format to another, typically at the baseband level; however in this document, those terms are alternatively used, particularly "encoding" which is used in a wider context expressing any form of transforming information from one format to another, either at the baseband level or at the carrier level or a combination thereof (such a combination is also known as modulation).

Many modulation methods are known and practiced in the art, for analog information, such as: Amplitude Modulation (AM); Frequency Modulation (FM); Phase Modulation (PM); and for digital information, such as: Amplitude Shift Keying (ASK); Frequency Shift Keying (FSK); Phase Shift Keying (PSK); and Minimal Shift Keying (MSK).

Modulation methods can be compared according to complexity of implementation and efficiency of conveying information in terms of throughput and noise immunity. Some modulation techniques enable conveying relatively much information per provided bandwidth, but might trade off the noise immunity, while others may better suit noisy channels. Accordingly, communication systems and applications adopt this or that modulation method. Over the years, less efficient modulation methods phased out and were been replaced by more efficient modulation techniques, usually digital. Typically, such digital modulation methods are implemented along with more efficient schemes of baseband data encoding, including data compression and error correction coding. Examples for this trend are military radios moving from analog FM to digital PSK or MSK or GMSK modulation achieving denser channel spacing and higher data rates per channel; cellular communication migrating from wide band analog AMP to narrow band NAMP modulation, or to digital GSM standards; Television and video cable broadcasting migrating from very wideband analog VHF and UHF channels to more compact digital modulation and data compression (e.g. MPEG) over significantly narrower broadcasting channels.

In some cases, even after applying such modern and efficient modulation schemes, a further upgrade can be achieved, to increase the system throughput. In the scope of the present invention, this typically applies to communication systems that transmit on periodic basis, at predefined transmission timing, i.e. the nominal time of transmission is basically known to the receiver, and modification of this nominal transmission timing can be interpreted as modulation of data.

An example for such a system is the satellite Search and Rescue (SAR) system known as Cospas-Sarsat. Though the present invention is not limited to this specific system, Cospas-Sarsat is a good example to clarify the present art, as well as the present invention, so it is specifically enlightened here. A detailed description of the system is provided in www.cospas-sarsat.org or www.cospas-sarsat.com.

Cospas-Sarsat is a satellite communication system to assist SAR of people in distress, all over the world and at anytime. The system was launched in 1982 by the USA, Canada, France and the Soviet Union (now Russia) and since then, it has been used for thousands of SAR events and has been instrumental in the rescue of over 20,000 lives worldwide. The goal of the system is to detect and locate signals from distress radio beacons and forward the data to ground stations, in order to support all organizations in the world with responsibility for SAR operations, whether at sea, in the air or on land. The system uses spacecraft—Low Earth Orbit (LEO) and Geostationary (GEO) satellites; and in the future also Medium Earth Orbit (MEO) satellites; Cospas-Sarsat radio beacons transmit in the 406 MHz band. The position of the beacon is determined either by the Doppler shift of the received beacon signal or by position coordinates modulated on the signal, provided by a Global Navigation Satellite System (GNSS) receiver integrated in the radio beacon.

As a skilled person probably appreciates, GNSS is usually a general term, as well as GPS (Global Positioning System) and SPS (Satellite Positioning System) and SNS (Satellite Navigation System); these acronyms may generalize particular systems such as the USA GPS or the Russian GLONASS or the European GALILEO. In the scope of the present invention, unless referring to a specific system, the terms GNSS and GPS usually relate to a generic satellite navigation system, therefore encompassing all kinds of specific navigation or positioning satellite systems.

All Cospas-Sarsat beacons are subject to the same RF specifications, yet may employ a different mechanical structure and different activation method, possibly also slight differences in the data message modulated on the signal; those differentiations usually reflect different applications, typically marine or airborne or terrestrial, so several types of beacons are defined accordingly: a) Emergency Position Indicating Radio Beacon (EPIRB) for marine use; b) Emergency Locator Transmitter (ELT) for aviation use; and c) Personal Locator Beacon (PLB) for personal and/or terrestrial use. For the purpose of the present invention, the terms EPIRB or PLB are alternatively used, and unless indicated otherwise, these terms relate to generic radio location beacons, therefore encompassing all kinds of specific location beacons.

The Cospas-Sarsat standard defines two different lengths of messages to be modulated on a 406 MHz carrier: 112 ("short message") or 144 ("long message") bits long.

Three levels of position resolution can be encoded in these restricted in length messages:

a) position data in the short message with a resolution of either 15 minutes (of an arc) or 2 minutes;

b) position data in the long message with a resolution of 4 minutes ("User Location Protocol");

c) position data in the long message with a resolution of 4 seconds ("Standard Location Protocol" or "National Location Protocol");

As a skilled person may appreciate, even the highest resolution of 4 seconds provides a worst case error of 4/60*1 NM, i.e. approximately 125 meters (1 NM=1 Nautical Mile=1853 meters). For several scenarii, e.g. searching for a person fallen overboard a vessel at a stormy dark night, even an error of 125 meters might be critical. Yet, if four more bits could be communicated to augment the Latitude and four bits to augment the Longitude, this ambiguity of 125 meters could shrink to 125/16, i.e. approximately 8 meters only. At this distance, a person may be significantly better heard and seen.

When activated, automatically or manually, a Cospas-Sarsat beacon transmits short signals, each about 0.5 seconds long, repetitively every 50 seconds plus or minus 2.5 seconds; this variation of the beacon transmission repetition rate should be random, according to the standard, to minimize transmission collisions among beacons.

It is then an object of the present invention to use this permitted variation in the transmission timing of the beacon to communicate data that augments the beacon report, particularly providing a finer resolution to the geographical coordinates reported in the beacon's message.

It is also an object of the present invention to provide a radio beacon configured to transmit data messages according to present or future protocols, using present art modulation methods, enabling conveying additional data, without modifying the present signal, but only its transmission timing.

It is further an object of the present invention to provide a receiver configured to demodulate the present art message transmitted by beacons, and also demodulate the auxiliary data communicated through variations of the transmission timing.

It is another object of the present invention to upgrade communication systems, which communicate information using any type of analog or digital modulation, such as Amplitude Modulation (AM); Frequency Modulation (FM); Phase Modulation (PM); Amplitude Shift Keying (ASK); Frequency Shift Keying (FSK); Phase Shift Keying (PSK); increasing these systems throughput by adding an auxiliary modulation that utilizes the timing of transmission of the already modulated signal.

It is yet another object of the present invention to provide a method to communicate data by modulating the predefined transmission timing of a transmitter, yet keeping a random or pseudo random variation of the transmission timing.

Many radio beacons, particularly Cospas-Sarsat beacons, comprise GNSS receivers, which in the recent years became low size and low power and low cost, thus much more popular. Integrating a GNSS receiver in the radio beacon enables locating this beacon much more accurately than using the Doppler method. Then, it is another object of the present invention to employ GNSS timing signals in the process of determining the transmission or reception timing, and possibly also use positioning data in order to calculate the difference or offset of the reception timing from the transmission timing.

Other objects and advantages of the invention will become apparent as the description proceeds.

SUMMARY OF THE INVENTION

The invention is directed to a method for communicating data from a transmitter to a receiver comprising the steps of:

a) configuring the transmitter to periodically transmit a signal detectable by the receiver;

b) determining a nominal transmission timing for said signal at the transmitter, and correspondingly determining the expected nominal receiving timing of said signal at the receiver;

c) defining a set of symbols to be communicated, common to the transmitter and the receiver;

d) defining an encoding table, common to the transmitter and the receiver, associating a unique time period with each of said symbols;

e) encoding a specific symbol at the transmitter by modifying said signal nominal transmission timing, for one transmission, by the time period associated with this specific symbol;

f) measuring at the receiver the time difference between the time of detection of said signal and the expected time of detection of said signal according to said nominal receiving timing;

g) determining at the receiver the unique time period in said encoding table closest in value to said measured time difference;

h) determining at the receiver the symbol in the encoding table associated with said closest in value unique time period, as the decoded symbol.

Utilizing signals arrived from a Global Navigation Satellite System (GNSS), such as the USA GPS, can significantly assist in accurately and synchronously determining the nominal transmission timing and/or nominal receiving timing. The GNSS timing signals provide a universal common timing base, available everywhere, which the transmitter and the receiver can acquire and synchronize with.

Both the transmitter and the receiver may agree upon specific transmission timing, for example one transmission every minute exactly when the Time of Day (TOD) indicated by a GNSS receiver shows the beginning of a new minute. As a skilled person may appreciate, the current TOD is a standard message output by GPS receivers, detailing the current year, day in the year, hour, minute and second; this TOD refers to a 1 PPS (Pulse Per Second) square wave also output by the GPS receiver, which defines very accurately the second transition, usually better than in 10 ppm from the universal time. Still, there is the propagation delay between the transmitter and the receiver which should be considered in order to determine the receiving timing, i.e. when are these signals expected to be received. For transmissions traveling at the speed of light [C], the propagation delay is equal to the distance between the transmitter and the receiver divided by C. As a skilled person may appreciate, this distance can be determined at the receiver, using the position coordinates of the transmitter and the receiver, also derived from a GNSS. The position coordinates acquired at the transmitter can be communicated to the receiver, modulated on the standard transmitted signal.

So if the nominal transmission timing is based on a fixed time interval of 60 seconds between consecutive transmissions, and transmissions are nominally scheduled to each time the TOD reads "00" seconds, then, for timing modulation purposes, it is possible to move the nominal transmission timing up to half the way back to the previous transmission or half the way forth to the next transmission, without changing the order of consecutive transmissions. So the unique time period which is used to encode a symbol, is set between minus half of this time interval to plus half of this time interval; following the present example, this range is between −30 seconds to +30 seconds. Further, different values of unique time periods can be defined within this range, to encode different symbols. As a skilled person may appreciate, in order to maximize the noise immunity of the modulation according to the present method, this range is evenly divided by the number of symbols, achieving a uniform difference between any two close unique time periods. In other words, the difference between close values of the unique time period in the encoding table is substantially equal to the time interval between successive transmissions divided by the number of symbols in the encoding table. For example, defining an encoding table with 8 symbols (3 bits), for the above discussed transmission repetition interval of 60 seconds, may be achieved by defining eight unique time periods as close as 60/8=7.5 seconds to each other, set between −30 s to +30 s, and specifically at: −26.25 s, −18.75 s, −11.25 s, −3.75 s, +3.75 s, +11.25 s, +18.75 s, +26.25 s, relatively to the nominal transmission timing of 00 s.

Furthermore, a shorter time window around each nominal time of transmission can be used for modulation according to the present invention, rather than the large window from minus to plus half of the time interval between successive transmissions. Preferably, only a certain percentage of this time interval is used for modulation, so each unique time period is between minus half of this percentage of the time interval to plus half of this percentage of the time interval. For example, if this percentage is 10%, and the time interval between consecutive transmissions is 60 seconds, then unique time periods would be between −3 s to +3 s. Subsequently, for an encoding table with 8 symbols, the unique time periods are set as close as 10%×60/8=0.75 seconds to each other, and specifically at: −2.625 s, −1.875 s, −1.125 s, −0.375 s, +0.375 s, +1.125 s, +1.875 s, +2.625 s.

As already mentioned, the present method can be applied either on unmodulated waves (also known as Continuous Waves—CW), or modulated waves. The present method does not restrict the nature of the pre modulated signal. Some non limiting examples are: Amplitude Modulation (AM); Frequency Modulation (FM); Phase Modulation (PM); Amplitude Shift Keying (ASK); Frequency Shift Keying (FSK); Phase Shift Keying (PSK); Minimum Shift Keying (MSK).

As a skilled person may appreciate, it is important in the present method to define reliable criteria for determining the time of detection of a signal. For unmodulated signals (i.e. signals which do not bear any modulation beyond the present method modulation), such a criterion can be the detection of energy above or below a predefined threshold in a predefined frequency band, typically around the carrier frequency. For modulated signals (e.g. AM, FM, PSK etc, beyond the present method modulation), determination of the signal reception time can be based on more complex criteria, typically measured on the demodulated (also known as baseband) signal. Some non limiting examples for criteria to determine the time of detection by the receiver, applied on the demodulated received signal are: detecting energy above or below a predefined threshold in a predefined frequency band; transitions of data at a predefined rate; correlation with a predefined pattern of data; or a combination thereof. Such detection methods are well practiced in the art, using filters and comparators for signal energy detection, Phase Lock Loops (PLLs) to detect the expected baseband data rate, and digital correlators (also known as matched filters) to detect specific patterns of data.

The present method may employ a further variation, based on relative measurements between consecutive transmissions and receptions. According to this variation, the nominal transmission timing is shifted after each transmission by the modulated time period and the nominal receiving timing is shifted after each reception by the demodulated time period. In other words, after each transmission, the nominal transmission timing is preset, referring to the last time of transmission as a new base for the nominal transmission. Then, the receiver may decode the transmitted symbol by measuring the time difference between consecutive receptions. This way, the receiver task is much easier, since it does not require to consider the propagation delay (assuming that the distance between transmitter and receiver is not significantly changed between consecutive transmissions). Yet, such a variation is more sensitive to noise, and if one transmission is not detected, the next symbol cannot be decoded.

In some systems, the transmission timing may vary, yet in a random or pseudo-random way. This can be due to a requirement to decrypt the modulated data, or to whiten (i.e. remove or conceal specific information from the transmitted signal, such as specific data, data rate, frequency, timing, etc.) it, or prevent consistent transmission collisions. For example, the Cospas-Sarsat standard requires a nominal time interval of 50 seconds between consecutive transmissions, yet randomly varying up to +/−2.5 seconds. In the standard words: "The repetition period shall not be so stable that any two transmitters appear to be synchronized closer than a few seconds over a 5-minute period. The intent is that no two beacons will have all of their bursts coincident. The period shall be randomised around a mean value of 50 seconds, so that time intervals between transmission are randomly distributed on the interval 47.5 to 52.5 seconds"—http://www.cospas-sarsat.com/DocumentsTSeries/T1OCT30.08_CompleteDoc.pdf (page 11 clause 2.2.1).

For these and other reasons, the present method suggests adding the following steps:

i) at the transmitter, after associating a unique time period with the symbol to be communicated, mapping this unique time period to a second unique time period also defined in the encoding table, according to a first function, and using this second time period for encoding said symbol;

ii) at the receiver, after determining the time period in said encoding table closest in value to said measured time difference, mapping this closest in value time period to a fourth unique time period also defined in the encoding table, according to a second function, and determining the symbol in the encoding table associated with this fourth time period, as the decoded symbol.

In particular, both of these first function and second function can be pseudo-random or random permutations of unique time periods in the encoding table, and for any specific transmission and corresponding reception, these functions can be correlated in such way that if applying the first function on a first time period in the encoding table provides a second time period, then applying the second function on this second time period provides said first time period. In other words, if the first function maps the "n" time period in the encoding table to the "m" time period in this table, then the second function maps the "m" time period back to the "n" time period, for the transmission and reception of the same signal.

Another way that the present method suggests for randomizing the modulated transmission timing is accomplished by adding the following steps:

i) at the transmitter, after associating a unique time period with the symbol to be communicated, determining a first pseudo random number, generating a modified time period which is a first function of said unique time period and said first pseudo random number, then using the modified time period for encoding said symbol;

ii) at the receiver, after measuring the time difference between the time of detection and the expected time of detection of said signal, determining a second pseudo random number, generating a corrected time difference which is a second function of said measured time difference and said second pseudo random number, determining the unique time period in said encoding table closest in value to said corrected time difference, then determining the symbol in the encoding table associated with this unique time period closest in value to the corrected time difference, as the decoded symbol.

A special case of the latter method is where the first pseudo random number and the second pseudo random number are identical for the transmission and corresponding reception of the same signal, and wherein the first function is identical with the second function, both functions are EXclusive OR (XOR) of the digital binary representation of the corresponding pseudo random number and time period. As a skilled person may appreciate, Xoring a number with itself provides "0", and Xoring a number with "0" does not change this number; so naming the digital binary representation of this pseudo random number as PRN, and the digital binary representation of the time period as T, then: T (XOR) PRN (XOR) PRN=T; so the two correspondingly XOR operations at the transmitter and at the receiver cancel each other, enabling decoding at the receiver the original symbol which was encoded at the transmitter. This of course assuming that the demodulation of the time modulated transmission is done with no error, or up to a certain permitted error.

The present method can be applied to a special case, where the transmitter is a radio beacon (i.e. radio that transmits data automatically, not necessarily operated by a human) and its transmitted signal is configured to communicate telemetry; then, the transmitted symbols are configured to augment this telemetry. This way, conventional radio beacons can easily be upgraded by the present invention, increasing their throughput by relatively simple modifications, possibly even just in software.

For example, this telemetry can comprise data bits representing the geographical coordinates of the beacon, and these symbols can provide a finer resolution for these coordinates. As already mentioned, the most detailed Cospas-Sarsat message type, in terms of position resolution, reports the beacon location up to 4 seconds (of an arc). Then, applying the present method with an encoding table of 256 symbols can provide 8 additional bits to augment the representation of the beacon coordinates. If 4 of these bits augment the Longitude and 4 other bits augment the Latitude, then the location resolution can be refined by $2^4=16$, to $4/16=0.25$ seconds, i.e. about 8 meters (worst case, by the equator).

Then, naturally, the receiver which receives these signals can be configured to determine the location of said beacon, even more accurately than according to the present art. It is also possible that the receiver would not determine the beacon location but just act as a relay or proxy for a remote station where the beacon location is determined. The latter is typical to spatial systems, where the space borne receiver relays the beacon transmission, possibly partially processed, to ground stations. For example, the demodulation of the transmission timing according to the present invention can be done either at the receiver or at a remote station coupled to the receiver or a combination thereof.

The invention is further directed to a system for communicating data from a transmitter to a receiver, said transmitter configured to periodically transmit a signal detectable by said receiver, at a predetermined nominal transmission timing, and said receiver configured to determine the correspondingly expected nominal receiving timing of said signal; said transmitter and receiver configured to define a common set of symbols to be communicated between thereof, and a common encoding table associating a unique time period with each of said symbols; said transmitter further configured to encode a specific symbol by modifying said signal nominal transmission timing, for one transmission, by the time period associated with this specific symbol; said receiver configured to decode said symbol be measuring the time difference between the time of detection of said signal and the expected time of detection of said signal according to said nominal receiving timing, determine the time period in said encoding table closest in value to said measured time difference and consequently select the symbol associated with said closest in value time period from said encoding table.

In this system, at least one of said transmitter or said receiver may comprise a GNSS receiver, wherein this GNSS receiver is configured to provide signals for determination of at least one of the nominal transmission timing or the nominal receiving timing.

In this system, said transmitter can be a radio beacon and said signal configured to communicate telemetry and said symbols configured to augment this telemetry.

In this system, said transmitter may further comprise a GNSS receiver, and configured as a radio beacon to communicate telemetry, this telemetry comprising a representation of the geographical coordinates of the transmitter provided by said GNSS receiver and wherein the encoded symbols are configured to provide a finer resolution of these geographical coordinates.

In this system, said receiver may further comprise a GNSS receiver, and said receiver further configured to determine the distance and direction to said transmitter.

The invention is also directed to a computer program product in a computer readable medium for communicating data from a transmitter to a receiver comprising:

a) for a respective transmitter, means for periodically transmit a signal detectable by a receiver;

b) for a respective transmitter, means for determining a nominal transmission timing for said signal; and correspondingly for a respective receiver, means for determining the expected nominal receiving timing of said signal;

c) for a respective transmitter and a respective receiver, means for defining a set of common symbols to be communicated between thereof;

d) for a respective transmitter and a respective receiver, means for defining a common encoding table, associating a unique time period with each of said symbols;

e) for a respective transmitter, means for encoding a specific symbol by modifying said signal nominal transmission timing, for one transmission, by the time period associated with this specific symbol;

f) for a respective receiver, means for measuring the time difference between the time of detection of said signal and the expected time of detection of said signal according to said nominal receiving timing;

g) for a respective receiver, means for determining the time period in said encoding table closest in value to said measured time difference;

h) for a respective receiver, means for determining the symbol in the encoding table associated with said closest in value time period, as the decoded symbol.

Other objects and advantages of the invention will become apparent as the description proceeds.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein:

FIG. 1a shows the Nominal Transmission Timing, without any encoding/modulation. Three transmissions are shown (grey rectangles), with a fixed time interval of t=10 between consecutive transmissions. FIG. 1b depicts the encoding table, obtaining eight different symbols (000, 001 . . . 111), each associated with a unique time period (−1, −2 . . . +4), accordingly. FIG. 1c shows the Transmission Timing encoded/modulated with the symbols 100, 001 and 010. According to the encoding table, 100 is associated with a unique time period of +1, so encoding 100 in the transmission timing is implemented by moving the transmission timing from the nominal transmission time (dotted line rectangle) t=0 to the modulated transmission time (grey rectangle) t=1. Similarly, 001 is associated with a unique time period −2, so is encoded by moving the transmission timing from the nominal t=10 time to the modulated t=8 time, and 010 which is associated with a unique time period −3 is encoded by moving the transmission timing from the nominal t=20 time to the modulated t=17 time.

FIG. 2a depicts the nominal transmission timing and FIG. 2b depicts the corresponding nominal receiving timing, delayed due to the propagation between the transmitter and the receiver. FIG. 2c depicts a modulated transmission timing (showing the second transmission transmitted earlier than the nominal timing), and FIG. 2d depicts the corresponding modulated receiving timing, similarly delayed due to the propagation delay between the transmitter and the receiver.

FIG. 3a shows the Nominal Transmission Timing, similarly to FIG. 1a, and FIG. 3b depicts the encoding table, similarly to FIG. 1b. FIG. 3c illustrates the relative version of the method for encoding data in Transmission Timing as disclosed by the present invention. Two symbols are consecutively encoded, 001 and 010. According to the encoding table, 001 is associated with a unique time period of −2 and 010 is associated with a unique time period of −3. Yet, before encoding, the nominal transmission timing (dotted rectangles) is adjusted according to the actual time of transmission (grey rectangles) of the last transmitted signal, so the nominal transmission timing relevant to the transmission of 001 is set to t=11, keeping a nominal time interval of 10 from the prior transmission made at t=1; then, the symbol 001 is encoded by moving the adjusted nominal transmission timing by a −2 time period, i.e. transmitting at t=11−2=9. Consecutively, the next nominal transmission timing is adjusted and set to t=19, keeping a nominal time interval of 10 from the previous transmission made at t=9; then, the symbol 010 is encoded by moving the adjusted nominal transmission timing by −3, i.e. transmitting at t=19−3=16.

FIG. 4a shows the Nominal Transmission Timing, similarly to FIG. 1a, and FIG. 4b depicts the encoding table, based on FIG. 1b but adding two columns to illustrate this randomization method. As can be seen, the values in the two right columns of this encoding table (titled "key-1" and "key-2") are permutations of the values listed in the second from left column (titled "unique time period"). FIG. 4c illustrates the randomized transmission timing. The symbol 001 is encoded according to the key-1 permutation of unique time period, which was originally −2 and changed to −1; the symbol 010 is encoded according to the key-2 permutation of unique time period, which was originally −3 and changed to −4.

FIG. 5a shows the Nominal Transmission Timing, set to 1 transmission every 50 seconds. FIG. 5b depicts the encoding table: 8 different symbols are listed, each associated with a unique time period; each unique time period is represented by an eight bits word (third column from left); each word representing a unique time period is XORed by a pseudo random number, which is 00110101 in this non limiting example, forming words representing the modified time period (second from right column). The most right column shows the modified time periods corresponding to these 8 bit word XOR products. FIG. 5c illustrates the randomized transmission timing. The symbol 110 is encoded by changing the nominal transmission time from t=50 to t=52.16, according to a modified time period of +2.16 seconds; the symbol 001 is encoded by moving the nominal transmission time from t=100 to t=97.88, according to a modified time period of −2.12 seconds.

FIG. 6 shows a Transmitter Block Diagram, according to the present invention. The picture shows a microprocessor, including RAM and EPROM, coupled to a GNSS receiver and to an RF transmitter. The GNSS receiver and the RF transmitter are shown each with its matching antenna. Two specific interfaces are indicated between the GNSS receiver and the microprocessor: 1 PPS (1 Pulse Per Second) clock and TOD (Time Of Day) message. Two specific interfaces are indicated between the microprocessor and the transmitter: Tx (transmission) control and Tx data.

DETAILED DESCRIPTION

The invention is directed to a method for communicating data from a transmitter to a receiver comprising the steps of:

a) configuring the transmitter to periodically transmit a signal detectable by the receiver;

b) determining a nominal transmission timing for said signal at the transmitter, and correspondingly determining the expected nominal receiving timing of said signal at the receiver;

c) defining a set of symbols to be communicated, common to the transmitter and the receiver;

d) defining an encoding table, common to the transmitter and the receiver, associating a unique time period with each of said symbols;

e) encoding a specific symbol at the transmitter by modifying said signal nominal transmission timing, for one transmission, by the time period associated with this specific symbol;

f) measuring at the receiver the time difference between the time of detection of said signal and the expected time of detection of said signal according to said nominal receiving timing;

g) determining at the receiver the unique time period in said encoding table closest in value to said measured time difference;

h) determining at the receiver the symbol in the encoding table associated with said closest in value unique time period, as the decoded symbol.

As a skilled person may appreciate, step (a) above represents the well known practice of configuring a transmitter and a receiver to communicate information in between. This step comprises configuring a common communication channel, determining its center frequency and bandwidth, adjusting properly the transmitter output power and the receiver sensitivity, agree upon a common modulation scheme (e.g. ASK, FSK, PSK) with corresponding parameters, configuring the baseband data rate, the data format, and so on, as regularly applied in the art.

Figure 1:
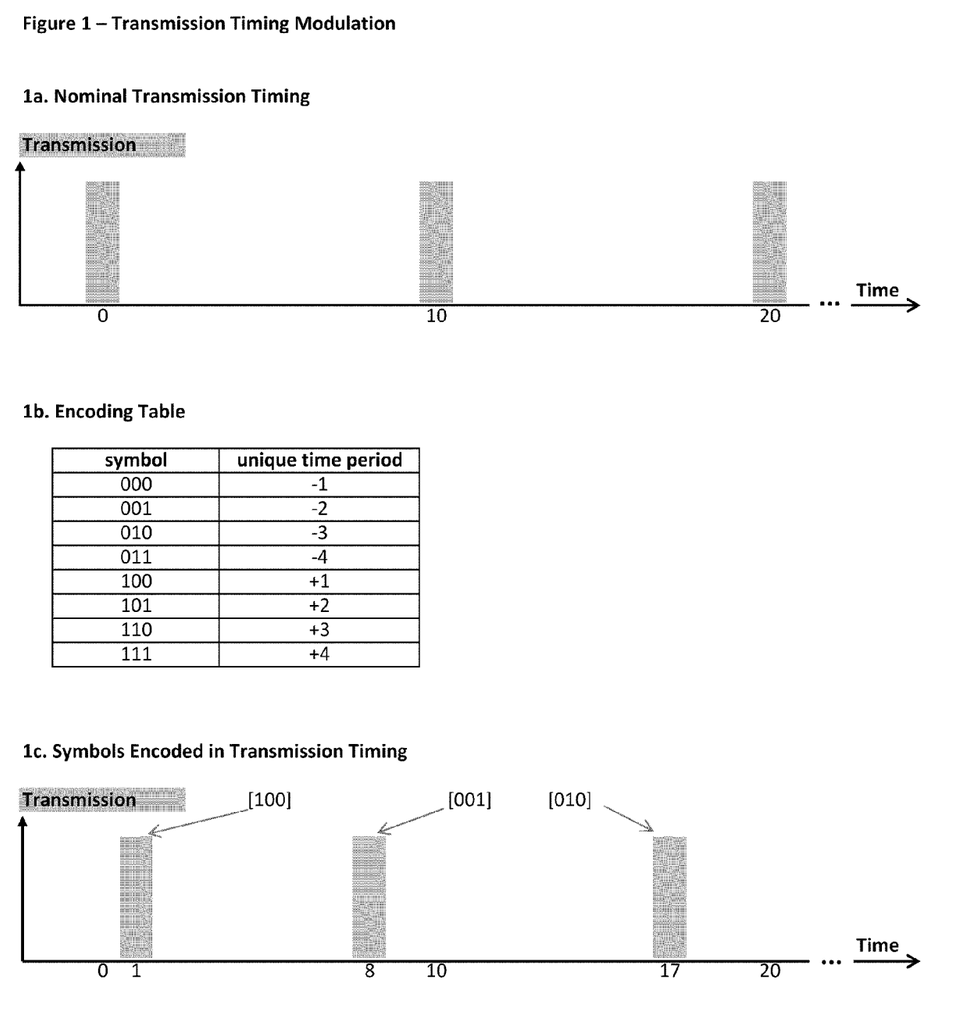
FIG. 1 illustrates the method for Transmission Timing Modulation according to the present invention.

FIG. 1 shows the principles of the Transmission Time Modulation according to the present invention. FIG. 1a depicts the Nominal Transmission Timing, prior to the presently suggested transmission timing modulation. Three transmissions are shown, at t=0, t=10 and t=20, representing periodical transmissions at a nominal timing. Basically, "t" may be expressed in any time unit, yet without limiting the present invention, t is considered hereinafter to be expressed in seconds.

Figure 6:
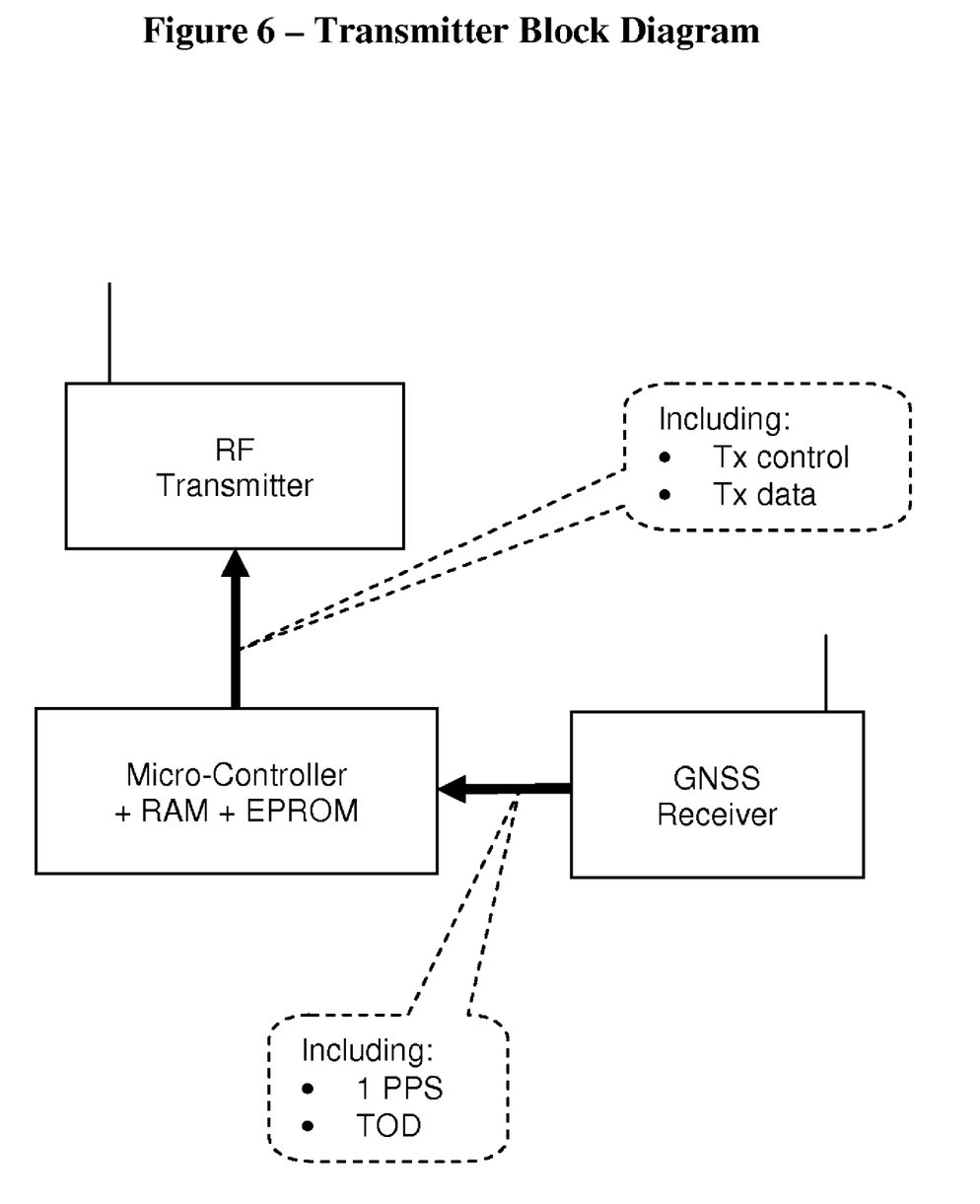

FIG. 6 depicts the Transmitter Block Diagram, according to a first embodiment of the invention. As shown, the transmitter comprises a microprocessor (including RAM and EPROM), which among other tasks is responsible to determine the transmission timing, coupled to a GNSS (GPS) receiver and to an RF transmitter. As known, GPS receivers are ubiquitous nowadays, and many vendors offer such products, in the form of chips or chipsets to be embedded in electronic devices. For reference, one may relate to u-blox products: NEO-5, LEA-5 or AMY—http://www.u-blox.com/. As well practiced in the art, GPS receivers often output a precise square wave at 1 hertz, typically named 1 PPS (Pulse Per Second), and a Time of Day (TOD) message, detailing the current year, month, day in the year and time, to 1 second resolution. This TOD refers to the near 1 PPS signal, while this 1 PPS is typically accurate at least to 10 ppm (i.e. deviated from the universal time by less than 10 micro seconds). According to this first embodiment, the microprocessor runs an internal 1-10 MHz clock, and synchronizes its internal clock to the 1 PPS and TOD received from the GPS receiver, in order to determine a precise transmission timing.

Microprocessors are also very known products in the art, as a skilled person probably appreciates. The first embodiment of the invention relates to a microcontroller from the MSP430 family, provided by Texas Instruments (TI). For reference, one may look at—http://focus.ti.com/mcu/docs/mcuprodoverview.tsp?sectionId=95&tabId=140&familyId=342

Then, according to this first embodiment, the microprocessor activates the transmitter every 10 seconds, exactly at the 1 PPS transition associated with the TOD indicating that the least significant number of seconds is changing from 9 to 0 (from 9 to 10, from 19 to 20, from 59 to 0, etc.).

Figure 7:
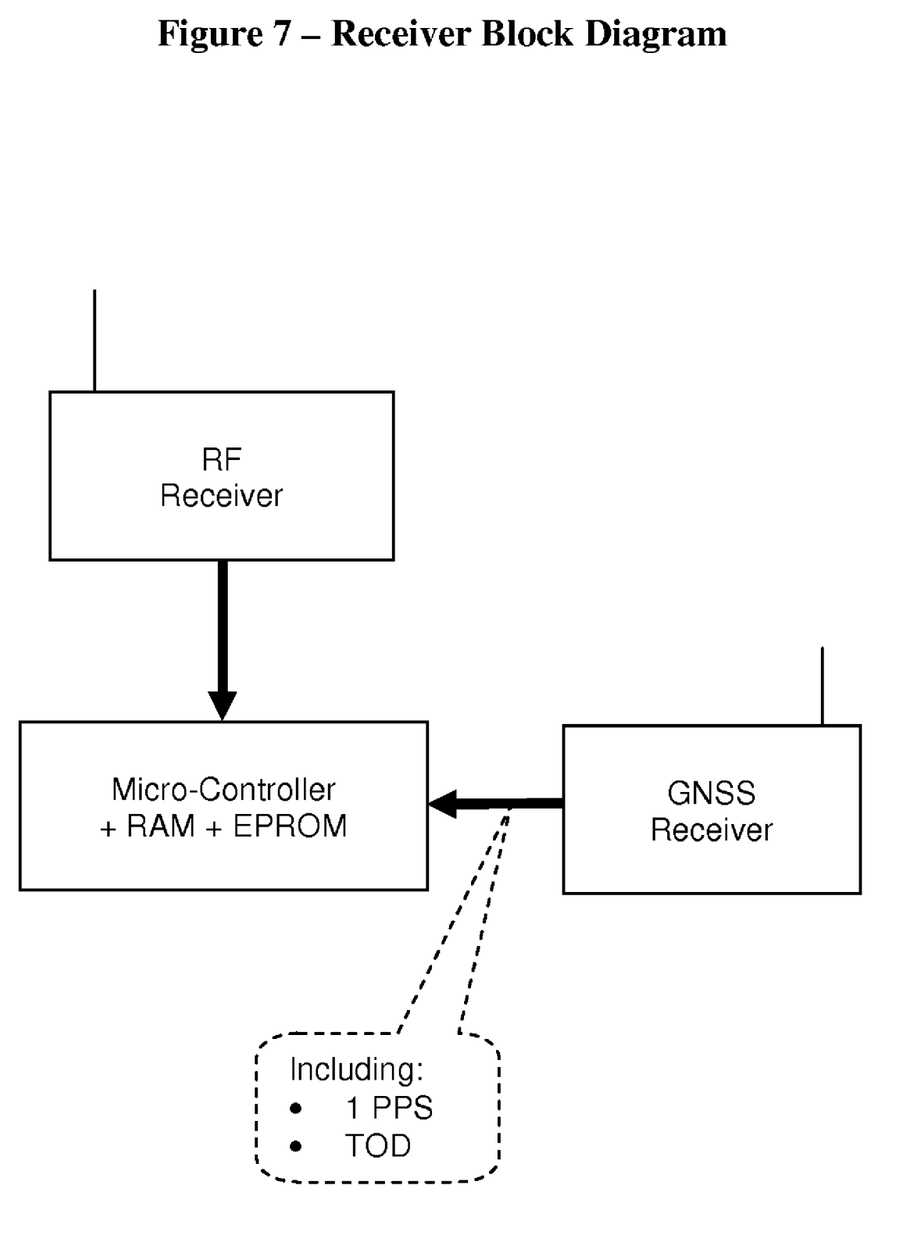
FIG. 7 shows a Receiver Block Diagram, according to the present invention. The picture shows a microprocessor, including RAM and EPROM, coupled to a GNSS receiver and to an RF receiver. The GNSS receiver and the RF receiver are shown each with its matching antenna. Two specific interfaces are indicated between the GNSS receiver and the microprocessor: 1 PPS (1 Pulse Per Second) clock and TOD (Time Of Day) message.

FIG. 7 depicts the Receiver Block Diagram, according to the first embodiment of the invention. As shown, the receiver comprises a microprocessor, which among other tasks is responsible to determine the receiving timing, coupled to a GNSS (GPS) receiver and to an RF receiver. According to this first embodiment, the microprocessor uses the 1 PPS and TOD information provided by the coupled GPS receiver, to determine the receiving timing, similarly (but not always identically) as done at the transmitter.

If the transmitter and the receiver are distanced not more than 300 Kilometers from each other, the propagation delay of the RF transmission is approximately 1 millisecond (ms) or less. Then, if the modulation of the transmission timing is in significantly wider steps, such as 5 ms and more, then the propagation delay can be neglected (assuming precise time detection, which will be discussed later), and the receiver may adopt the nominal transmission timing as its nominal receiving timing. In this case, the receiver can also regard the 1 PPS transition associated with the TOD indicating that the least significant number of seconds is changing from 9 to 0 as the expected time to receive a signal, i.e. the nominal receiving timing. This approach and this safety noise limit of 5 ms between close values of time periods used to modulate the nominal transmission timing, obviously limit the number of symbols that can be encoded.

FIG. 1b depicts the encoding table, according to the first embodiment, obtaining eight different symbols (000, 001 . . . 111), each associated with a unique time period (−1, −2 . . . +4), accordingly. Assuming units of seconds, this encoding table indicates that the nominal transmission timing can be modified in steps of 1 second, forth to 4 seconds and back to −4 seconds. It's also possible, with this encoding scheme, to transmit a signal not been time modulated (i.e. keep the nominal transmission timing). Obviously, this encoding scheme conveys only 3 bits of data, however obtains very good noise immunity. A skilled person can see that a propagation delay of approximately 200 ms or less can be ignored in this case, corresponding to a distance up to 60,000 Km. Such a distance is larger than the range of LEO (Low Earth Orbit) and MEO (Medium Earth Orbit) and GEO (Geostationary) satellites from earth, so practically, this scheme is free from propagation delay corrections.

FIG. 1c shows the Transmission Timing modulated with the symbols 100, 001 and 010. According to the encoding table and to the first embodiment, 100 is associated with a unique time period of +1 s, so encoding 100 in the transmission timing is implemented by moving the transmission timing from the nominal t=0 time (dotted rectangle) to the modulated t=1 s time (grey rectangle). Similarly, the symbol 001 is associated with a unique time period of −2 s, so is encoded by moving the transmission timing from the nominal t=10 s time to the modulated t=8 s time, and 010 which is associated with a unique time period of −3 s is encoded by moving the transmission timing from the nominal t=20 s time to the modulated t=17 s time.

Figure 2:
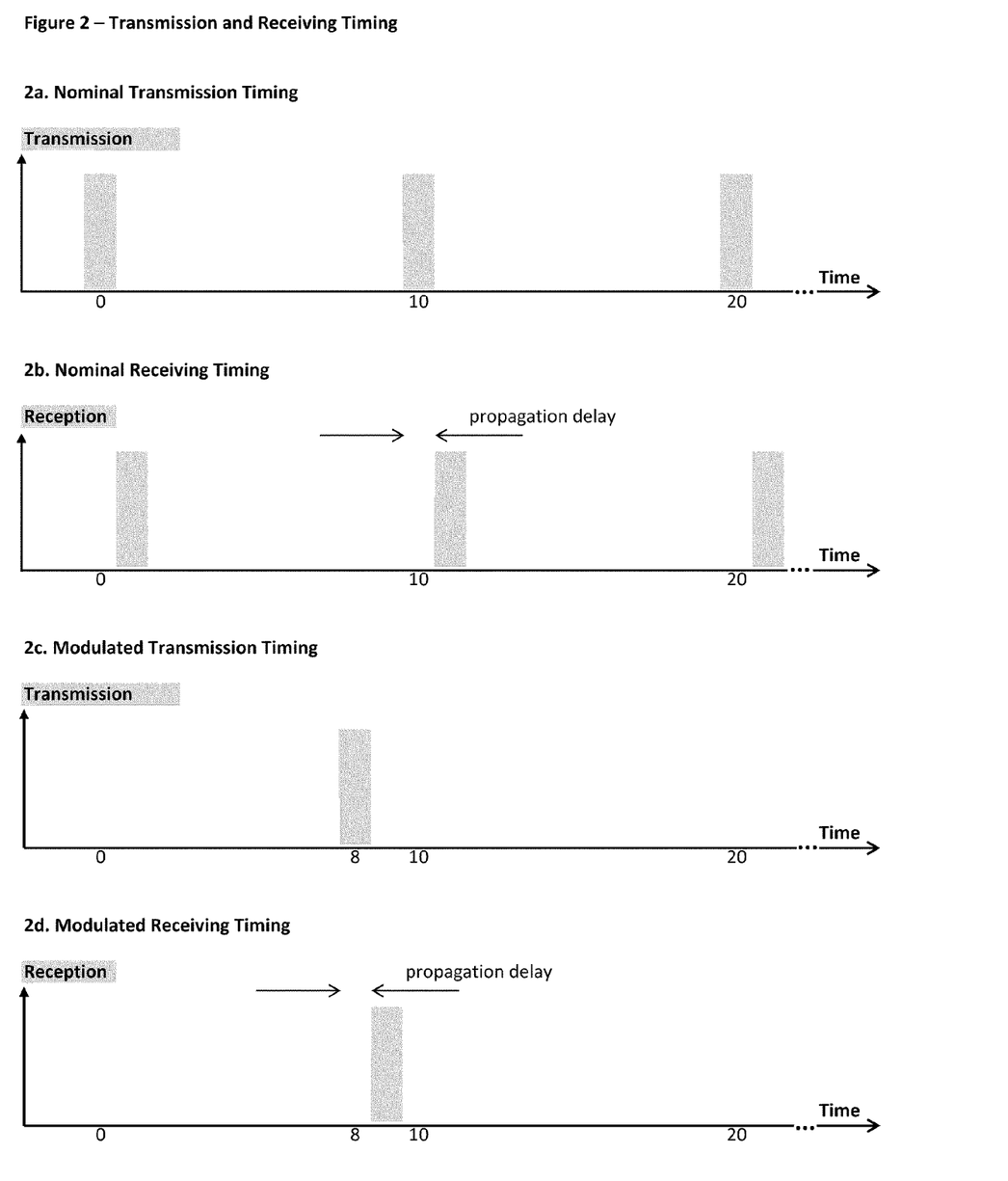
FIG. 2 shows the Transmission and Receiving Timing.

It is possible then to define a much larger number of symbols, yet considering the propagation delay. Then, the nominal receiving timing is determined based on the nominal transmission timing and the estimated distance between the transmitter and the receiver; for RF propagation in the air, this distance divided by the speed of light [C] is substantially equal to the propagation delay. FIG. 2 illustrates the corresponding Transmission and Receiving Timing, in the nominal and modulated modes. FIG. 2a depicts the nominal transmission timing and FIG. 2b depicts the related nominal receiving timing, delayed due to the propagation time between the transmitter and the receiver. FIG. 2c depicts the modulated transmission timing and FIG. 2d depicts the related modulated receiving timing, similarly delayed due to the propagation delay between the transmitter and the receiver. The propagation delay is not in scale, for illustration purposes.

Knowing the nominal receiving timing, the difference between the actual time of detection and the expected time of detection of the signal according to the nominal receiving timing is measured at the receiver; as shown in FIG. 2d, this time difference is measured between the leading edge of the grey rectangle (time of detection) and the leading edge of the dotted rectangle to its right (nominal receiving timing), resulting with about −2 (seconds); then, determining the time period in the encoding table (FIG. 1b) closest in value to this measured time difference results in −2; determining the symbol in the encoding table (FIG. 1b) associated with this closest in value time period, results with 001.

In several cases, the distance between the transmitter and the receiver is known in advance, within an acceptable uncertainty. For example, if the transmitter is placed by the surface of the globe (e.g. on the ocean or even on land), and the receiver is mounted on a GEO satellite, then the transmitter and the receiver are known to be approximately 35,000-40,000 Kms apart, so a propagation delay of less than 150 ms can be considered. The distance uncertainty in this case is due to the earth radius, which is approximately 6400 Kms, yielding a propagation delay variation of about 20 ms. Then, for practical considerations, time periods for modulation can be defined 100 ms apart from each other without requiring a specific correction for the exact place of the transmitter on earth, provided that a constant correction is applied to compensate for the average distance and corresponding propagation delay from transmitters placed by the earth surface to these GEO satellites.

Further, the distance between the transmitter and the receiver can be more accurately estimated using the position coordinates of both the transmitter and the receiver, derived from the GPS. According to the first embodiment, the transmitter position coordinates are determined using GPS, and are communicated to the receiver in the transmitted signal, in a standard modulated (e.g. ASK or FSK or PSK) message.

To ensure that the receiver will distinguish between consecutive transmitted signals, the time modulation is limited to avoid two nominally consecutive signals from changing their order, when timing modulation is applied. Thus, the extreme value of the unique time period used for timing modulation is limited in between minus half the time interval between consecutive transmissions to plus half the time interval between consecutive transmissions. Then, in order to achieve balanced noise immunity, this time interval is populated by a number of unique time periods, each associated with a unique symbol, wherein the difference between close values of these unique time periods substantially equals to the time interval between consecutive transmissions divided by the number of symbols. According to FIG. 1a, the time interval between consecutive transmissions is 10 s, and according to FIG. 1b there are 8 symbols and the difference between close values of unique time periods is usually 1 s, except of 2 s between +1 s and −1 s; Yet, the time interval between successive transmissions divided by the number of symbols is 10/8=1.25. So a more compact way to set the unique periods of time could be: −4.375 s, −3.125 s, −1.875 s, −0.625 s, +0.625 s, +1.875 s, +3.125 s, +4.375 s.

According to a second embodiment of the invention, the nominal time interval between consecutive transmissions is set to 50 s, yet only 10% of this time interval is used for time modulation. Then, the unique periods of time used for the modulation are set between minus half of this percentage of time interval, i.e. −2.5 s, to plus half of this percentage of time interval, i.e. +2.5 s. Subsequently, the difference between close values of unique time periods in the encoding table is set substantially equal to 50 s×10%=5 s, divided by the number of symbols in the encoding table.

The second embodiment of the invention is related to the Cospas-Sarsat SAR satellite system. This embodiment is intended to comply with the Cospas-Sarsat requirements yet also improve the system performance. So a nominal transmission timing of one transmission every 50 seconds is according to Cospas-Sarsat requirements, as well as the transmission timing accepted change between −2.5 s to +2.5 s. Using a GPS receiver at the transmitter, to determine the position and precise universal time, and knowing the precise position and time at the receiver, enable determining the nominal transmission timing at the transmitter and the nominal receiving timing at the receiver with great accuracy, particularly as the transmitted signal carries a 144 bits message indicating its location at a sub kilometer resolution. Then, according to this second embodiment, another 8 bits of location coordinates are defined, to be conveyed through the present time modulation method. Four of these bits are allocated to latitude and four bits augment the longitude of the beacon. These 8 bits define $2^8=256$ different symbols, each symbol associated with a unique time period, to modulate the transmission timing. Then, the difference between close values of unique time periods in the encoding table is set substantially equal to this percentage of time interval (50 s×10%=5 s) divided by the number of symbols in the encoding table (256), i.e. about 20 ms. The result is the following 256 values of unique periods of time:

+/−10 ms, +/−30 ms, +/−50 ms, +/−70 ms, +/−90 ms, (accumulated 10 entries)

+/−110 ms, +/−130 ms, +/−150 ms, +/−170 ms, +/−190 ms, (accumulated 20 entries)

. . .

+/−910 ms, +/−930 ms, +/−950 ms, +/−970 ms, +/−990 ms, (accumulated 100 entries)

. . .

+/−1910 ms, +/−1930 ms, +/−1950 ms, +/−1970 ms, +/−1990 ms, (accumulated 200 entries)

+/−2010 ms, +/−2030 ms, +/−2050 ms, +/−2070 ms, +/−2090 ms, (accumulated 210 entries)

. . .

+/−2410 ms, +/−2430 ms, +/−2450 ms, +/−2470 ms, +/−2490 ms, (accumulated 250 entries)

+/−2510 ms, +/−2530 ms, +/−2550 ms; (accumulated 256 entries)

Clearly, if it is mandatory to limit the timing modifications exactly to +/−2.5 s, the above values can be scaled down by ~2% or the number of symbols can be slightly reduced or a combination thereof. Still, for a Cospas-Sarsat message that reports the latitude and longitude at a standard resolution of 4 seconds of an arc, the extra 4 bits augmentation to each of the latitude and longitude according to the second embodiment of the invention improve the position report resolution from about 125 to 8 meters.

According to this second embodiment, the transmitted signal is PSK modulated, on a 406 MHz carrier, according to the Cospas-Sarsat specifications. Then, this PSK modulated signal is further time modulated according to the present invention. Alternatively, the present method can be applied on signals that previously went through other types of modulation, such as: Amplitude Modulation (AM); Frequency Modulation (FM); Phase Modulation (PM); Amplitude Shift Keying (ASK); Frequency Shift Keying (FSK); Minimum Shift Keying (MSK), or unmodulated carriers (CW).

As shown in FIG. 6, the microprocessor in the transmitter gets inputs from the GPS receiver, indicating the TOD and precise 1 PPS. Based on that, the microprocessor can precisely control the time of transmission, with a proper control signal which it sends to the RF transmitter, named "Tx control" (also known in the art as PTT—Press To Talk, yet usually in a human operation context). As seen in FIG. 7, the receiver also gets TOD and 1 PPS signals from the GPS, which it uses to determine the nominal receiving timing. However, determining the precise time of reception is more difficult. As a skilled person may appreciate, there are various methods in the art to determine that valid information is been received, as well as determining the precise time of reception of this information. For detecting a non modulated signal, e.g. an RF carrier at 406 MHz, the receiver may be configured with a band pass filter around this frequency, and when monitoring energy above a predefined threshold, at the output of this filter, a valid reception can be determined. If a modulated signal is transmitted (e.g. ASK, FSK, PSK), as usually is the case, then the receiver demodulates the signal according to present art methods. Then, the time of detection can be determined by monitoring the demodulated (base band) signal, searching for evidence of specific information which was apparently transmitted. This search can be for: a) energy above or below a predefined threshold in a predefined frequency band; b) transitions of data at a predefined rate; c) correlation with a predefined pattern of data; or a combination thereof.

According to the second embodiment of the invention, the transmitted signal complies with the Cospas-Sarsat standard, carrying 144 bits of information PSK modulated at 400 bits per second, on a 406 MHz carrier (more exactly: one of 34 specific channels, each 3 KHz wide, between 406.001 MHz to 406.100 MHz). The format of this message is preferably:

Bit Synchronization Filed—15 bits: 111111111111111;

Frame Synchronization Field—9 bits: 000101111; (excluding test mode)

Short/Long Message Format Bit—1 bit: 1; (long message)

Message—119 bits;

Then, the receiver is preferably configured to tune to one of these 34×406 MHz channels, apply PSK (+/−1.1 radians) demodulation at 400 bits per second, decode the biphase L encoding (also known as Manchester code, a XOR product of data and clock) and search for a specific pattern of data (for further details, one can refer to the Cospas-Sarsat beacon specifications). This specific pattern of data been searched may be the above indicated Frame Synchronization Field of 9 bits. Since the data rate is not high, only 400 bps, a correlator searching for these 9 bits pattern can be implemented in software. This correlator can be configured to tolerate some errors or no errors at all. According to the second embodiment, the correlator is configured to tolerate one error.

For a Bit Error Rate (BER) of 10%, the probability to detect this correlation pattern, tolerating one error is: $9\times[(BER)^1\times(1-BER)^8]+[1-BER]^9=9\times[(0.1)^1\times(0.9)^8]+(0.9)^9=0.775$.

The false alarm rate at these conditions is: $9\times[(0.5)^1\times(0.5)^8]+[0.5]^9=0.0195$. At 400 bps, this means an average of one false alarm per $1/0.0195\times 9/400$ sec=1.15 seconds;

As a skilled person may comprehend, the detection probability increases as the BER decreases (expected to be less than 10% at line of site conditions between a radio beacon and a satellite mounted receiver); also, if no errors are tolerated by the correlator, the false alarm rate can be improved to an average of one false alarm per $1/(0.5)^9\times 9/400$ sec=11.5 seconds.

Yet, according to the second embodiment, the detection and false alarm rates are accordingly improved by considering the whole message preamble of 25 bits as a correlation pattern, i.e. including the 15 synchronization bits, the 9 frame synchronization bits and the 1 long/short message flag (assuming a good autocorrelation of this pattern, which avoids false alarms when shifted). Configuring the correlator to search for the 25 bits pattern, and accepting up to 2 wrong bits, at BER=5%, yields:

Detection probability—$25\times24\times\frac{1}{2}\times[(0.05)^2\times(0.95)^{23}]+25\times[(0.05)^1\times(0.95)^{24}]+(0.95)^{25}=0.87$ False alarm probability—$25\times24\times\frac{1}{2}\times(0.5)^{25}+25\times(0.5)^{25}+(0.5)^{25}=0.00001$ This false alarm rate corresponds to 1 false alarm per $1/0.00001\times 9/400$ sec=38 minutes.

Then, immediately upon detecting the synchronization pattern, a short time after receiving the last bit of this pattern, the microprocessor records the current time and determines it as the detection time.

Figure 3:
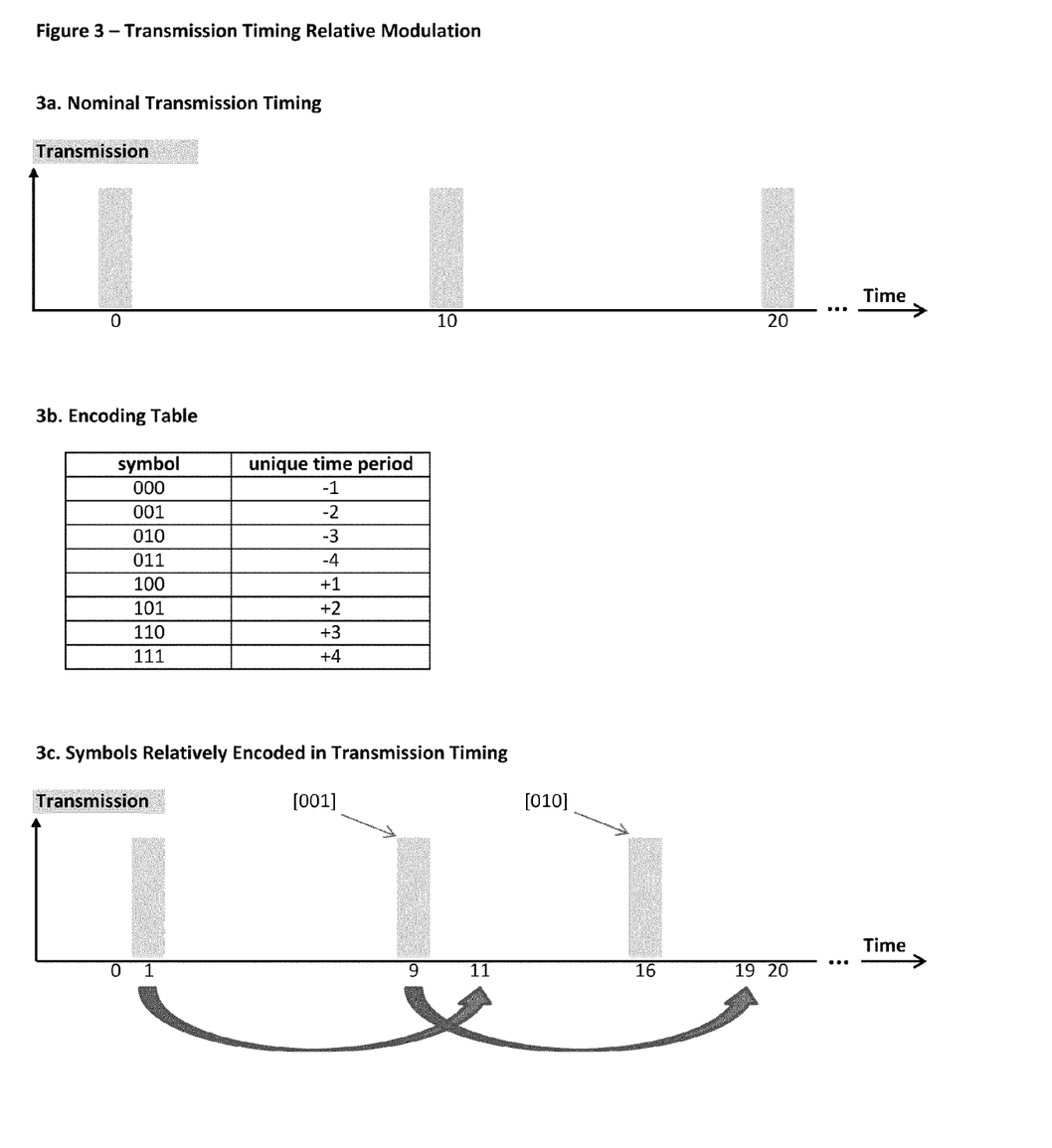
FIG. 3 illustrates the Transmission Timing relative modulation method, according to the present invention.

According to a third embodiment, the nominal transmission timing is shifted after each transmission by the lastly modulated time period, and the nominal receiving timing is shifted after each reception by the lastly demodulated time period. This variation of the present method is illustrated in FIG. 3. FIG. 3a shows the Nominal Transmission Timing and FIG. 3b shows the encoding table, similarly as applicable to the first embodiment previously discussed and respectively shown in FIGS. 1a and 1b. Yet FIG. 3c shows a different method compared to FIG. 1c. FIG. 3c depicts two symbols, 001 and 010, consecutively encoded according to the relative modulation scheme; before encoding 001, the nominal transmission timing (depicted as a dotted rectangle) is adjusted according to the time of transmission of the last transmitted signal, which was t=1, so the nominal transmission timing for the transmission of 001 is set to t=11, meeting a nominal time interval of 10; then, the symbol 001 is encoded according to the encoding table shown in FIG. 3b, moving the adjusted nominal transmission timing by −2 and setting the transmission time (grey rectangle) to t=11−2=9. Subsequently, the next nominal transmission time (dotted rectangle) is adjusted and set to t=9+10=19, meeting a nominal time interval of 10; then, the symbol 010 is encoded by moving the adjusted nominal transmission timing by −3, according to the encoding table, setting the transmission time to t=19−3=16. So, after each transmission, the nominal transmission time is set 10 units of time forward from the time of the last transmission, and the receiver decodes the transmitted symbol by measuring the time difference between consecutive receptions. The advantage of this third embodiment is that no propagation delay should be considered at the receiver, totally independent on the distance between the transmitter and the receiver; yet, if one transmission is not detected, the next symbol cannot be decoded.

According to this aspect of the invention, the relative time modulation is used along with the Greenwich Time Signal (GTS), popularly known as the pips. The GTS is a series of six short tones broadcast by many BBC radio stations at the end of each hour to mark the precise start of the following hour. It normally comprises six pips in total, which occur on the 5 seconds leading up to the hour and on the hour itself. Each pip is a 1 kHz tone which, for the five leading pips, lasts a tenth of a second, while the final pip lasts half a second. The hour changes at the very beginning of the last long pip. The time interval between the beginnings of successive pips is normally 1 second. Then, according to the third embodiment of the present invention, one bit of information is modulated on this GTS timing, to indicate a tsunami alert. Accordingly, if no tsunami is forecast, the GTS is kept as normal; yet, to alert for a possible near tsunami, the $3^{rd}$ pip of the GTS is broadcast 0.5 seconds after the $2^{nd}$ pip (instead of 1 sec) and also the $4^{th}$ pip is broadcast 0.5 seconds after the $3^{rd}$ pip, providing a redundancy to confirm with the previous indication. The receiver can be an off the shelf radio, so the decoding (demodulation) of the encoded (modulated) information is done simply by a human hear, unrestricted to language barriers; in addition, this timing modulation can be decoded by a simple electronic circuit, whose output is coupled to further systems distributing the alert on additional channels, such as loud speakers or sirens.

In some systems, the transmission timing may or is required to vary in a random or pseudo-random way. Such randomization may be required for various reasons, such as: reducing transmission collisions among transmitters; decreasing interception probability; decreasing jamming probability; or even improving detection performance, as PLLs might require. In particular, the transmitter according to the second embodiment of the invention, which is planned to meet the Cospas-Sarsat specifications, requires a transmission repetition interval of 50 seconds in average, yet randomly varying at 47.5-52.5 seconds. As indicated earlier, the transmission timing according to the second embodiment is possibly modulated by one of 256 different time periods, from +/−10 ms to +/−2550 ms, at 20 ms steps; each of these different time periods representing different position coordinates, in a way that a change in location of about 8 meters changes the modulated time period, i.e. changes the transmission timing. Typically, 8 meters are in the range of error of commercial GPS receivers, so the transmission timing of the radio beacon according to the second embodiment is expected to vary, even if the beacon does not move.

Yet, in order to better randomize the transmission timing in the required +/−2.5 sec window, the second embodiment of the invention suggests adding a step at the transmitter and a step at the receiver as following:

i) at the transmitter, after associating a unique time period with the symbol to be communicated, mapping this unique time period to a second unique time period also defined in the encoding table, according to a first function, and using this second time period for encoding said symbol;

ii) at the receiver, after determining the time period in said encoding table closest in value to said measured time difference, mapping this closest in value time period to a fourth unique time period also defined in the encoding table, according to a second function, and determining the symbol in the encoding table associated with this fourth time period, as the decoded symbol.

Figure 4:
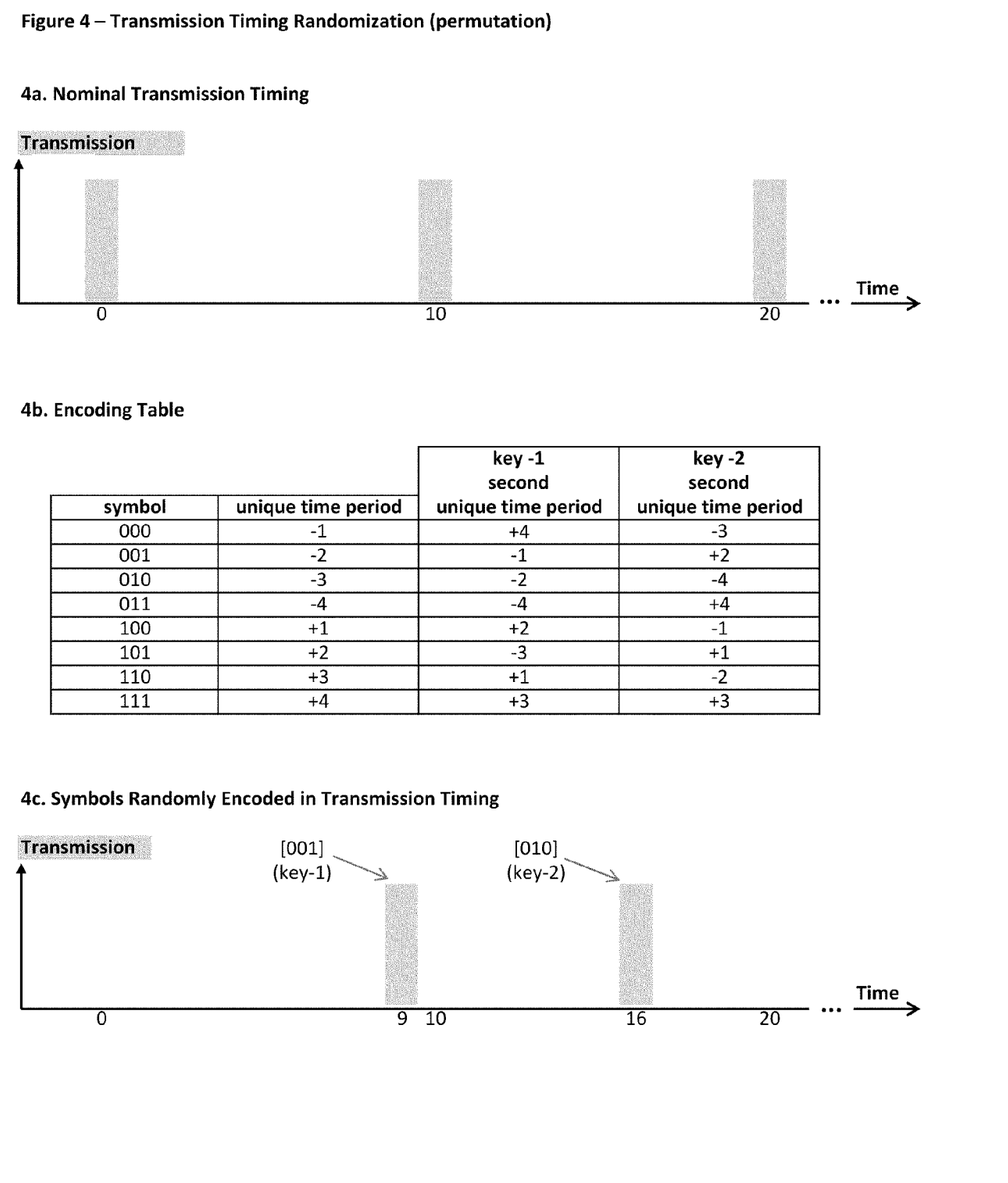
FIG. 4 illustrates the Transmission Timing randomization (permutation method), according to one of the embodiments of the present invention.

FIG. 4 illustrates this Transmission Timing randomization method. FIG. 4a shows a Nominal Transmission Timing of one transmission every 10 (seconds): at t=0, t=10 and t=20. FIG. 4b depicts the encoding table, which is based on FIG. 1b but adding two columns to illustrate this randomization method. The values in the two right columns of this encoding table (titled "key-1" and "key-2") are pseudo random or random permutations of the unique time periods listed in the second from left column (titled "unique time period") of the encoding table. Then, FIG. 4c illustrates the transmission timing modulation of two successive transmissions, correspondingly encoding the symbols 001 and 010, according to this randomization aspect of the invention. For communicating the symbol 001, applying the pseudo random or random permutation according to "key-1", the time period −2 that corresponds to 001 is mapped to a second time period which is −1; then, as shown in FIG. 4c, the symbol 001 is communicated by changing the nominal transmission time from t=10 to t=10−1=9; consecutively, applying a pseudo random or random permutation according to "key-2", on the time period −3 that corresponds to the symbol 010 (see the encoding table in FIG. 4b), provides a second time period which is −4; then, as shown in FIG. 4c, the symbol 010 is communicated by changing the nominal transmission time from t=20 to t=20−4=16.

The first function is then a permutation of the unique time period, mapping a unique time period in the encoding table to another (second) unique time period in the same encoding table; so a small change in position, due for example to a standard GPS error, may change the corresponding time period, but the randomization function can further change the time period selected for modulation, potentially cause a larger change in transmission timing. As shown in FIG. 4, a specific randomization function ("key-1") is used by the transmitter and the receiver for a specific transmission and corresponding reception of a signal, and a different function ("key-2") is used to randomize a consecutive transmission. Such functions or keys can be respectively stored in the transmitter and the receiver, and then selected according to the TOD, for example. Since both transmitter and receiver get the same precise TOD from their coupled GNSS receiver, according to the second embodiment, the TOD is suitable to coordinate said first function (at the transmitter) and said second function (at the receiver) used for randomization. Furthermore, according to the second embodiment, these randomization functions and/or keys depend on a unique Identification Data (ID) or Serial Number (S/N) of the transmitter, to avoid using the same randomization scheme by different beacons, keeping low collision rate among beacons. Such S/N is part of the Cospas-Sarsat message, so the receiver can acquire it by demodulating the standard PSK payload of the transmitted signal, and then use this S/N to select or generate the appropriate randomization (permutation) function or key. Clearly, the randomization functions or keys can be periodically inserted or set at the transmitter and at the receiver, or even communicated over the air between thereof.

As a skilled person may appreciate, the specific parameters shown in FIG. 4 (or other figures) are for illustration purposes only, and can be otherwise set according to specific systems needs. In particular, the method illustrated in FIG. 4 can be adjusted, according to the second embodiment of the invention, to comply with Cospas-Sarsat requirements, such as time interval between successive transmissions (mean value and acceptable variation).

According to a fourth embodiment of the invention, the transmission timing is further randomized adding a step at the transmitter and adding a step at the receiver, as following:

i) at the transmitter, after associating a unique time period with the symbol to be communicated, determining a first pseudo random number, generating a modified time period which is a first function of said unique time period and said first pseudo random number, then using the modified time period for encoding said symbol;

ii) at the receiver, after measuring the time difference between the time of detection and the expected time of detection of said signal, determining a second pseudo random number, generating a corrected time difference which is a second function of said measured time difference and said second pseudo random number, determining the unique time period in said encoding table closest in value to said corrected time difference, then determining the symbol in the encoding table associated with this unique time period closest in value to the corrected time difference, as the decoded symbol.

This randomization method, differently from the previously discussed randomization based on permutation of time periods, can generate modulated time periods which are not defined in the encoding table. Thus, it can provide a higher level of randomization of the time period, however is more susceptible to noise at the receiver. According to this fourth embodiment, the first pseudo random number and the second pseudo random number are identical for the transmission and the corresponding reception of the same signal; also, the first function is identical with the second function, both expressing an EXclusive OR (XOR) of the digital binary representation of the corresponding pseudo random number and time period, bit by bit.

Figure 5:
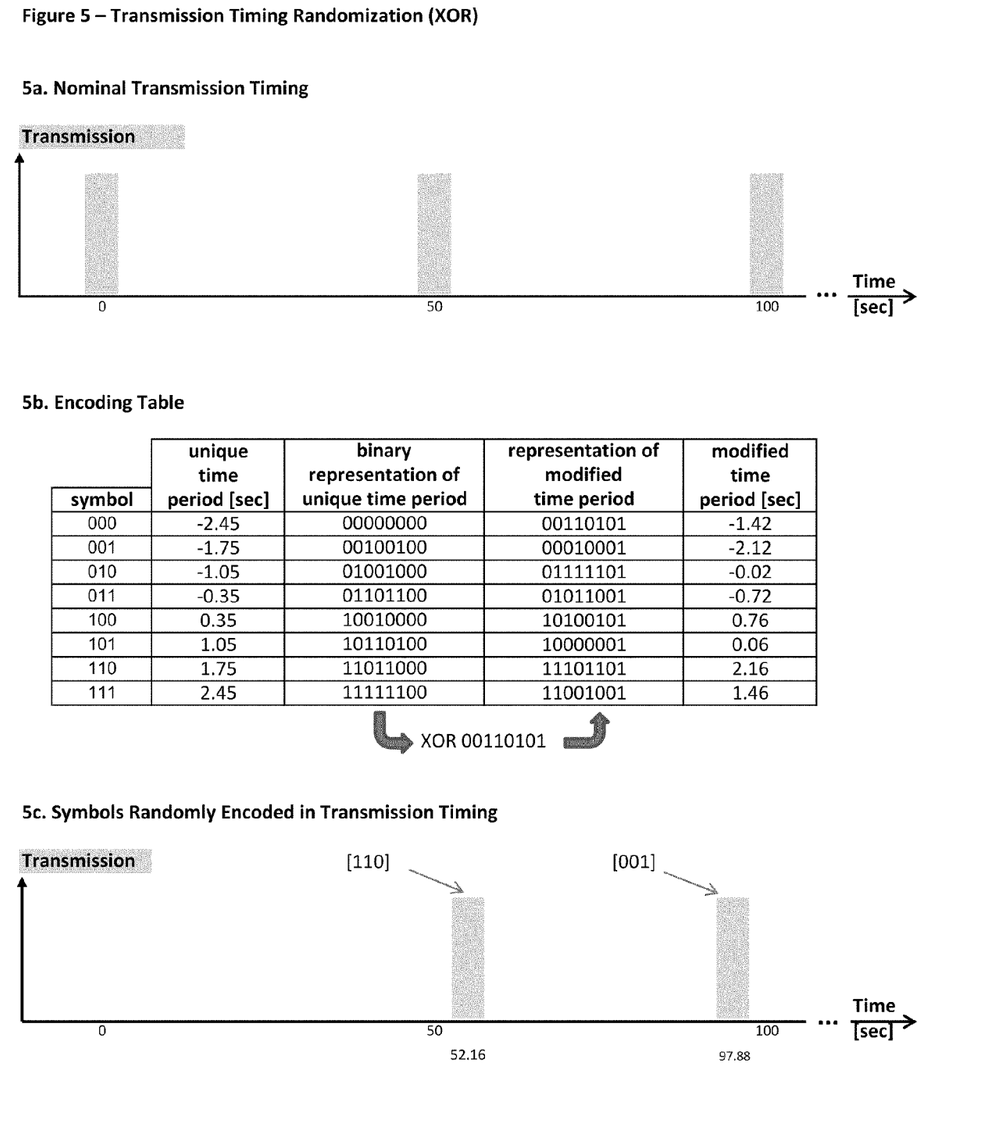
FIG. 5 illustrates the Transmission Timing randomization (XOR method), according to one of the embodiments of the present invention.

FIG. 5 illustrates this Transmission Timing randomization (XOR method). FIG. 5a shows a Nominal Transmission Timing of 1 transmission every 50 seconds, according to Cospas-Sarsat requirements. FIG. 5b depicts the encoding table: 8 different symbols are listed, each associated with a unique tome period, spanning between −2.45 sec to +2.45 sec, to meet the Cospas-Sarsat requirement for randomization of the transmission repetition time interval; each unique time period is represented by an eight bits word (for example: 110 is represented by 11011000), such that the difference between consecutive time periods is 0.7 sec, corresponding to a difference of 00100100 (36 in a decimal representation); each word in the third column from left, representing a unique time period, is then XORed with a pseudo random number, which is 00110101 in this non limiting example, forming words representing the modified time period (fourth column from left). For example: 11011000 XOR 00110101=11101101. Then, according to this method, the XOR product, which is the representation of the modified time period, is transformed to a modified time period (first column from right), to modulate the transmission timing. For example, as shown in FIG. 5c, the symbol 110 modifies the nominal transmission time (dotted rectangle) t=50 to the modulated transmission time (grey rectangle) t=52.16, by a modified time period of +2.16 seconds, originated from the unique time period of 1.75 seconds.

At the receiver, this randomization process is mirrored compared to the transmitting process (example parameters in parenthesis): a) measuring a time difference between the time of detection and the expected time of detection of the signal (+2.16 seconds, assuming no errors); b) determining a second pseudo random number (00110101, equal to the first pseudo random number); c) generating a corrected time difference which is a second function (XOR) of the digital binary representation (11101101) of the measured time difference (+2.16 sec) and said second pseudo random number (00110101), i.e. the corrected time difference=11101101 XOR 00110101=11011000; d) determining the unique time period in said encoding table closest in value to said corrected time difference: +1.75 sec; d) determining the symbol in the encoding table associated with this unique time period closest in value to the corrected time difference (+1.75 sec), as the decoded symbol: 110.

According to the second embodiment of the invention, and possibly also according to the fourth embodiment, the transmitter is configured to transmit a signal that communicates telemetry, and particularly its location coordinates. Then, the present invention is applied to augment this telemetry by communicating additional information through modulation of the transmission timing, particularly refining the location report. For example, A Cospas-Sarsat standard report indicating the beacon's latitude and longitude to 4 seconds of an arc can be refined by the present invention to 0.5 seconds of an arc by encoding additional 4 bits of latitude and 4 bits of longitude using an encoding table of 256 different time periods, i.e. improving the location resolution from about 125 to 8 meters.

The receiver which receives these signals is configured to determine the location of the beacon, detecting both the standard (e.g. PSK) modulated data and the transmission timing modulated data. The receiver can also relay the received information, partially processed. For example, the receiver can be mounted on a satellite, decode the transmission timing modulation and communicate the decoded information to a ground station, in any other way.

The invention is further directed to a system for communicating data from a transmitter to a receiver, said transmitter configured to periodically transmit a signal detectable by said receiver, at a predetermined nominal transmission timing, and said receiver configured to determine the correspondingly expected nominal receiving timing of said signal; said transmitter and receiver configured to define a common set of symbols to be communicated between thereof, and a common encoding table associating a unique time period with each of said symbols; said transmitter further configured to encode a specific symbol by modifying said signal nominal transmission timing, for one transmission, by the time period associated with this specific symbol; said receiver configured to decode said symbol be measuring the time difference between the time of detection of said signal and the expected time of detection of said signal according to said nominal receiving timing, determine the time period in said encoding table closest in value to said measured time difference and consequently select the symbol associated with said closest in value time period from said encoding table.

In this system, at least one of said transmitter or said receiver may comprise a GNSS receiver, wherein this GNSS receiver is configured to provide signals for determination of at least one of the nominal transmission timing or the nominal receiving timing.

In this system, said transmitter can be a radio beacon and said signal configured to communicate telemetry and said symbols configured to augment this telemetry.

In this system, said transmitter may further comprise a GNSS receiver, said telemetry comprising a representation of the geographical coordinates provided by said GNSS receiver and said symbols configured to provide a finer resolution of these geographical coordinates.

In this system, said receiver may further comprise a GNSS receiver, and said receiver further configured to determine the distance and direction to said beacon.

The invention is also directed to a computer program product in a computer readable medium for communicating data from a transmitter to a receiver comprising:

a) for a respective transmitter, means for periodically transmit a signal detectable by a receiver;

b) for a respective transmitter, means for determining a nominal transmission timing for said signal; and correspondingly for a respective receiver, means for determining the expected nominal receiving timing of said signal;

c) for a respective transmitter and a respective receiver, means for defining a set of common symbols to be communicated between thereof;

d) for a respective transmitter and a respective receiver, means for defining a common encoding table, associating a unique time period with each of said symbols;

e) for a respective transmitter, means for encoding a specific symbol by modifying said signal nominal transmission timing, for one transmission, by the time period associated with this specific symbol;

f) for a respective receiver, means for measuring the time difference between the time of detection of said signal and the expected time of detection of said signal according to said nominal receiving timing;

g) for a respective receiver, means for determining the time period in said encoding table closest in value to said measured time difference;

h) for a respective receiver, means for determining the symbol in the encoding table associated with said closest in value time period, as the decoded symbol.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method for communicating data from a transmitter to a receiver comprising the steps of:
   a) configuring the transmitter to periodically transmit a signal detectable by the receiver;
   b) determining a nominal transmission timing for said signal at the transmitter, and correspondingly determining the expected nominal receiving timing of said signal at the receiver;
   c) defining a set of symbols to be communicated, common to the transmitter and the receiver;
   d) defining an encoding table, common to the transmitter and the receiver, associating a unique time period with each of said symbols;
   e) encoding a specific symbol at the transmitter by modifying said signal nominal transmission timing, for one transmission, by the time period associated with this specific symbol;
   f) measuring at the receiver the time difference between the time of detection of said signal and the expected time of detection of said signal according to said nominal receiving timing;
   g) determining at the receiver the unique time period in said encoding table closest in value to said measured time difference;
   h) determining at the receiver the symbol in the encoding table associated with said closest in value unique time period, as the decoded symbol;
   wherein the nominal receiving timing is either:
      i. determined based on the nominal transmission timing and the estimated distance between the transmitter and the receiver; or
      ii. shifted after each reception by the demodulated time period, and wherein the nominal transmission timing is shifted after each transmission by the modulated time period.

2. The method as recited in claim 1, wherein the step of determining a nominal transmission timing or the step of determining the nominal receiving timing, or both steps, are accomplished using timing signals received from a Global Navigation Satellite System (GNSS).

3. The method as recited in claim 1, wherein the distance between the transmitter and the receiver is estimated using the position coordinates of both the transmitter and the receiver, and wherein the position coordinates of the receiver or the transmitter or both are determined using positioning signals received from a GNSS, and when the transmitter position coordinates are determined using positioning signals received from a GNSS, these position coordinates are communicated by the transmitted signal.

4. The method as recited in claim 1, wherein the nominal transmission timing is based on a fixed time interval between consecutive transmissions, each of said unique time period values is between minus half of a certain percentage of said time interval to plus half of said certain percentage of said time interval, and the difference between close values of said unique time period in said encoding table is substantially equal to said certain percentage of said time interval divided by the number of symbols in the encoding table.

5. The method as recited in claim 1, wherein said signal is further modulated according to at least one of: Amplitude Modulation (AM); Frequency Modulation (FM); Phase Modulation (PM); Amplitude Shift Keying (ASK); Frequency Shift Keying (FSK); Phase Shift Keying (PSK); Minimum Shift Keying (MSK).

6. The method as recited in claim 5, wherein the time of detection is determined at the receiver by demodulating the received signal and detecting in the base band at least one of: a) energy above or below a predefined threshold in a certain frequency band; b) transitions of data at a predefined rate; c) correlation with a predefined pattern of data.

7. The method as recited in claim 1, adding a step at the transmitter and adding a step at the receiver:
   i) at the transmitter, after associating a unique time period with the symbol to be communicated, mapping this unique time period to a second unique time period also defined in the encoding table, according to a first function, and using this second time period for encoding said symbol;
   ii) at the receiver, after determining the time period in said encoding table closest in value to said measured time difference, mapping this closest in value time period to a fourth unique time period also defined in the encoding table, according to a second function, and determining the symbol in the encoding table associated with this fourth time period, as the decoded symbol.

8. The method as recited in claim 7, said first function and said second function are pseudo-random or random permutations of unique time periods in the encoding table, and for any transmission and corresponding reception, applying the first function on a first time period in the encoding table provides a second time period, and applying the second function on this second time period provides said first time period.

9. The method as recited in claim 1, adding a step at the transmitter and adding a step at the receiver:
   i) at the transmitter, after associating a unique time period with the symbol to be communicated, determining a first pseudo random number, generating a modified time period which is a first function of said unique time period and said first pseudo random number, then using the modified time period for encoding said symbol;
   ii) at the receiver, after measuring the time difference between the time of detection and the expected time of detection of said signal, determining a second pseudo random number, generating a corrected time difference which is a second function of said measured time difference and said second pseudo random number, determining the unique time period in said encoding table closest in value to said corrected time difference, then determining the symbol in the encoding table associated with this unique time period closest in value to the corrected time difference, as the decoded symbol.

10. The method as recited in claim 1, wherein said transmitter is a radio beacon and said signal is configured to communicate telemetry and said symbols are configured to augment this telemetry.

11. The method as recited in claim 10, said telemetry comprising a representation of the geographical coordinates of the beacon, and said symbols providing a finer resolution for these coordinates.

12. The method as recited in claim 11, wherein said receiver is configured to determine the location of said beacon or relay data enabling determination of the location of said beacon.

13. A system for communicating data from a transmitter to a receiver, said transmitter configured to periodically transmit a signal detectable by said receiver, at a predetermined nominal transmission timing, and said receiver configured to determine the correspondingly expected nominal receiving timing of said signal; said transmitter and receiver configured to define a common set of symbols to be communicated between thereof, and a common encoding table associating a unique time period with each of said symbols; said transmitter further configured encode a specific symbol by modifying said signal nominal transmission timing, for one transmission, by the time period associated with this specific symbol; said receiver configured to decode said symbol be measuring the time difference between the time of detection of said signal and the expected time of detection of said signal according to said nominal receiving timing, determine the time period in said encoding table closest in value to said measured time difference and consequently select the symbol associated with said closest in value time period from said encoding table, wherein said signal is further modulated according to at least one of: Amplitude Modulation (AM); Frequency Modulation (FM); Phase Modulation (PM); Amplitude Shift Keying (ASK); Frequency Shift Keying (FSK); Phase Shift Keying (PSK); Minimum Shift Keying (MSK).

14. A system according to claim 13, at least one of said transmitter or said receiver comprising a GNSS receiver, wherein this GNSS receiver is configured to provide signals for determination of at least one of the nominal transmission timing or the nominal receiving timing.

15. A system according to claim 13, wherein said transmitter is a radio beacon and said signal is configured to communicate telemetry and said symbols are configured to augment this telemetry.

16. A system according to claim 15, said transmitter further comprising a GNSS receiver and configured to report its location, and said symbols are configured to augment this location report.

17. A system according to claim 16, said receiver further comprising a GNSS receiver, and said receiver further configured to determine the distance and direction to said beacon.

18. A computer readable medium storing a computer program for a transmitter, and a computer readable medium storing a computer program for a receiver, for communicating data from said transmitter to said receiver, comprising computer readable code:
 a) for the transmitter, for periodically transmit a signal detectable by the receiver;
 b) for the transmitter, for determining a nominal transmission timing for said signal; and correspondingly for the receiver, for determining the expected nominal receiving timing of said signal;
 c) for the transmitter and for the receiver, for defining a set of common symbols to be communicated between thereof;
 d) for the transmitter and for the receiver, for defining a common encoding table, associating a unique time period with each of said symbols;
 e) for the transmitter, for encoding a specific symbol by modifying said signal nominal transmission timing, for one transmission, by the time period associated with this specific symbol;
 f) for the receiver, for measuring the time difference between the time of detection of said signal and the expected time of detection of said signal according to said nominal receiving timing;
 g) for the receiver, for determining the time period in said encoding table closest in value to said measured time difference;
 h) for the receiver, for determining the symbol in the encoding table associated with said closest in value time period, as the decoded symbol;
 wherein the nominal receiving timing is either:
  i. determined based on the nominal transmission timing and the estimated distance between the transmitter and the receiver; or
  ii. shifted after each reception by the demodulated time period, and wherein the nominal transmission timing is shifted after each transmission by the modulated time period.

\* \* \* \* \*